United States Patent
Lamarre

(10) Patent No.: US 7,229,745 B2
(45) Date of Patent: Jun. 12, 2007

(54) LITHOGRAPHIC SEMICONDUCTOR MANUFACTURING USING A MULTI-LAYERED PROCESS

(75) Inventor: Philip A. Lamarre, Waltham, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 10/710,023

(22) Filed: Jun. 14, 2004

(65) Prior Publication Data

US 2005/0277064 A1    Dec. 15, 2005

(51) Int. Cl.
G03F 7/26    (2006.01)

(52) U.S. Cl. .................... 430/313; 430/394

(58) Field of Classification Search ............ 430/9, 430/14, 15, 311, 312, 313, 394
See application file for complete search history.

(56) References Cited

U.S. PATENT DOCUMENTS

| | | | |
|---|---|---|---|
| 4,204,009 A | 5/1980 | Feng et al. | 427/510 |
| 4,212,935 A * | 7/1980 | Canavello et al. | 430/326 |
| 4,533,624 A | 8/1985 | Sheppard | 430/312 |
| 4,645,562 A | 2/1987 | Liao et al. | 438/640 |
| 4,767,721 A | 8/1988 | Liao et al. | 438/420 |
| 4,770,739 A | 9/1988 | Orvek et al. | 438/717 |
| 4,784,936 A | 11/1988 | White et al. | 430/323 |
| 4,806,453 A | 2/1989 | Vidusek et al. | 430/312 |
| 4,863,827 A | 9/1989 | Jain et al. | 430/145 |
| 5,091,342 A | 2/1992 | Studebaker et al. | 438/577 |
| 5,140,469 A | 8/1992 | Lamarre et al. | 359/709 |
| 5,221,596 A | 6/1993 | Keller | 430/323 |
| 5,260,172 A | 11/1993 | Ito | 430/324 |
| 5,296,333 A | 3/1994 | Lamarre | 430/271.1 |
| 5,679,608 A | 10/1997 | Cheung et al. | 438/622 |
| 5,728,504 A | 3/1998 | Hosoda et al. | 430/192 |
| 5,817,444 A | 10/1998 | Sato et al. | 430/155 |
| 5,830,624 A | 11/1998 | Bae et al. | 430/323 |
| 5,889,788 A | 3/1999 | Pressly et al. | 714/726 |
| 6,156,487 A * | 12/2000 | Jennison et al. | 430/316 |
| 6,156,665 A | 12/2000 | Hamm et al. | 438/706 |
| 6,653,244 B2 * | 11/2003 | Behfar et al. | 438/780 |
| 6,811,853 B1 * | 11/2004 | Sherrer et al. | 428/138 |
| 2005/0074698 A1 * | 4/2005 | Borodovsky | 430/312 |
| 2006/0141385 A1 * | 6/2006 | Kaule | 430/270.1 |

* cited by examiner

Primary Examiner—Kathleen Duda
(74) Attorney, Agent, or Firm—Maine & Asmus

(57) ABSTRACT

Multilayer resist systems and techniques used for liftoff or planarizing topography wherein the dimensions and thicknesses of the layers are independently controlled. The undercut may also be independently controlled for precision structures.

12 Claims, 12 Drawing Sheets

LITHOGRAPHIC SEMICONDUCTOR MANUFACTURING USING A MULTI-LAYERED PROCESS

STATEMENT REGARDING FEDERALLY SPONSORED RESEARCH OR DEVELOPMENT

Portions of the present invention may have been made in conjunction with Government funding under contract number DAAB07-00-D-D329, and there may be certain rights to the Government.

CROSS-REFERENCE TO RELATED APPLICATIONS

No related applications.

BACKGROUND OF THE INVENTION

The invention relates to semiconductors, and more particularly, to systems and processes for fabrication of semiconductor devices.

The proliferation of integrated circuit (IC) semiconductor devices into human society has been nothing short of phenomenal. The rapid technological advancements that occurred since the discovery of transistor devices in the 1940's has catapulted human innovation and spearheaded astonishing advancements. The immense power associated with computing power and signal processing continues to rapidly alter the fabric of our society.

As known in the art, the fabrication of integrated circuit devices is a multiple-step process. As general background, the fabrication of standard silicon-based chips starts with raw silicon dioxide, the most common component of sand or glass. The silicon dioxide is heated in the presence of hydrogen to produce pure silicon. The silicon is then melted and formed into ingots that are sliced into wafers. While silicon has traditionally been the most common semiconductor material, other materials such as gallium arsenide and germanium as well as others are used for certain applications depending upon the performance requirements.

These wafers will eventually be transformed in the integrated circuits after a number of processing steps are performed. In general, the process steps can be grouped into several basic areas: Front End Processing, Back End Processing, Test and Packaging.

The Front End Processing refers to the initial steps in the wafer fabrication process wherein the silicon wafers are created from very pure silicon ingots and actual semiconductor devices or transistors are fabricated on the wafers. A typical front end process includes preparing the wafer surface, patterning and implanting dopants to obtain the desired electrical properties, growing or depositing the gate dielectric, and growing or depositing insulating materials to isolate neighboring devices.

After the integrated circuit devices have been developed they are electrically interconnected and assembled to form the electrical circuits for the desired product. The Back End Processing involves depositing various layers of metal and insulating material in desired patterns of conducting and insulating layers to create the electrical pathways. In general, the conductive metal layers consist of aluminum or copper, although other metals are known in the art. The insulating layers are generally formed with silicon dioxide or a silicate glass however other materials are also known in the art. The conductive layers are interconnected by etching holes, called "vias" in the insulating material.

Advancements in the semiconductor industry have resulted in many distinct wafer fabrication processes, allowing designers to optimize a particular design by selecting the best process for the device. In general, fabrication processes simply consist of a series of steps to deposit special material layers on the wafers one at a time in precise amounts and patterns.

Once the Back End Processing has been completed, the semiconductor devices are subjected to a variety of electrical tests to determine whether the integrated circuit device functions properly. Finally, the wafer is cut into individual die, which are then packaged in ceramic or plastic packages with pins or other connectors to the outside world.

The fabrication of circuits on the wafers thus requires that several different layers, each with different patterns, be deposited on the surface, and that doping of the active regions be done in very controlled amounts over tiny regions of precise areas. The various patterns used in depositing layers and doping regions on the substrate are defined by a process called photolithography. In general terms, photolithography refers to the process used in semiconductor device fabrication to transfer a pattern to the surface of a wafer or substrate. The transfer of this pattern allows for the definition of features to be etched in an underlying film or to provide a mask for ion implantation. In a complex integrated circuit a wafer may undergo photolithography multiple times.

In simple terms, the lithography process generally comprises applying at least one layer of photoresist material on the surface of a substrate. The resist layer is then selectively exposed to radiation with the exposed areas defined by the exposure device such as a mask. The photolithography or more succinctly, lithography, process generally commences with a layer of photoresist material that is spin-coated on the surface of the wafer. The resist is a light-sensitive material processed into specific patterns after being exposed to light energy in the shape of the desired pattern. The resist layer is then selectively exposed to radiation such as ultraviolet light, electrons, or x-rays, with the exposed areas defined by the exposure tool, mask or computer data.

After exposure, the photoresist layer is subjected to a development process. During development, the undesired areas in the photoresist are dissolved by the developer which dissolves undesired areas of the photoresist layer and exposes the corresponding areas of the underlying layer. Depending on the resist method, the development stage may dissolve either the exposed or unexposed areas. The areas with no resist material left on top of them are then subjected to additive or subtractive processes, allowing the selective deposition or removal of material on the substrate. In the case wherein the exposed areas become soluble in the developer, a positive image of the mask pattern is produced on the resist. Such a resist is therefore called a positive photoresist. Negative photoresist layers result in negative images of the mask pattern, wherein the unexposed areas are made soluble in the developer. Wafer fabrication may employ both positive and negative photoresists, although positive resists are generally used as they offer higher resolution capabilities.

The photoresist materials typically have three components, namely a matrix material or resin that provides body for the photoresist, an inhibitor or sensitizer which is the photoactive ingredient, and a solvent that keeps the resist in a liquid form until it is applied to the substrate.

Etching refers to the process of removing regions of the underlying material that are no longer protected by a photoresist and is typically described in terms of its level of isotropy. An isotropic etching process proceeds in all directions at the same rate, while an anisotropic etching process proceeds in only one direction. In general, etching processes fall between being completely isotropic and completely anisotropic. Wet etching, or etching with the use of chemicals tends to be isotropic while dry etching processes that employ reactive plasmas are generally anisotropic. The rate at which the etching occurs is known as the etch rate.

Thin films, as the name implies, is a layer with a high surface-to-volume ratio and are used in wafer fabrication. These films can be used to form a resistor, a conductor, an insulator, and even a semiconductor. The thin films can be deposited on a substrate by several means, such as thermal growing or by vapor deposition. A property of thins films is that they usually behave differently from bulk materials of the same chemical composition. For example, thin films are sensitive to surface properties, and relatively more sensitive to thermomechanical stresses. Furthermore, the thin films are influenced by the quality of adhesion to the underlying layer, the conformal coverage, residual or intrinsic stresses after deposition, and the presence of surface imperfections.

The adhesion of a thin film to the substrate or an underlying layer is one of the factors affecting the reliability of the thin film. A thin film that is initially adhered to the underlying layer but lifts off after the device is subjected to thermomechanical stresses may result in field failures. Reliable thin film adhesion depends upon many factors, including the cleanliness of the surface, and the roughness of the substrate/underlying layer among others. Regardless of the deposition process, thin films frequently end up with some intrinsic stresses that can lead to adhesion problems, corrosion, cracking, and deviations in electrical properties.

The metallization process refers to the formation of metal layers that electrically interconnect the various device structures fabricated on the silicon substrate. Aluminum and Gold are widely used materials for metallization, as they offer low resistivity and favorable adhesion compatibility with silicon dioxide. The metal layers may be deposited through Physical Vapor Deposition (PVD) by sputtering, which involves generating high-energy ions that bombard a target, and the ions sputter (eject) atoms from the target. The sputtered atoms reach the substrate and condense and form a thin film over the substrate.

The additive metallization technique known as "lift-off" was developed with the advent of electron beam lithography in the late 1960's. The lift-off techniques employ lift-off patterns and lift-off masks and the process is known in the art and described in "Integrated Circuit Fabrication Techniques", by David J. Elliot, Copyright 1982 McGraw Hill, N.Y. The lift-off process employs a sacrificial material such as the photoresist that is deposited and patterned on the substrate. The material of interest is then deposited on top of the sacrificial material. The sacrificial material is then removed, leaving behind only the material deposited directly on the substrate. These processes are useful for patterning materials that cannot be etched without affecting underlying materials on the substrate. There are additional reasons for using lift-off as is known in the art.

One form of lift-off is realized through electron beam processing. The electron beam lift-off process provides the metallization after the exposure and development of the resist. Basically, the lift-off technique uses the fact that electron scattering in the resist and back scattering from the substrate creates a tear-shaped energy absorption profile in the resist, which results in an undercut profile after resist development. In this way metal that is evaporated over the entire surface exhibits discontinuities between the metal on the substrate and the metal over the resist. During resist removal in a suitable solvent, the metal over the resist is also removed and a clean reproduction of the image is obtained in metal. An additional advantage of the lift-off technique is that multi-level metal structures can be formed because any material or combination of materials that can be evaporated can be used.

One of the reasons for the success of the electron beam lift-off process in electron beam lithography is the fact that the energy absorption in the resist film during exposure is not linear but reaches a maximum in about two-thirds of the beam penetration range. Thus, with proper exposure and development, adequate undercut resist profiles are obtainable. In the optical exposure of photoresist, however, energy absorption is highest at the top of the resist film and lowest at the interface between the resist and the substrate due to the attenuation of the light in the resist. Moreover, standing waves created by the light reflected from the substrate are a further complication. These exposure conditions make it difficult to obtain undercut or even vertical resist profiles with normal UV exposure of azide type positive photoresist. Using ammonia based image reversal is one popular method to form lift-off profiles using positive azide based photoresists.

Early multilayer lift-off pattern systems were designed for use in processes where the processing temperature exceeded 100 degrees Celsius. However, processes which are employed in the manufacture of lead-base Josephson junction superconducting devices such as lead, lead alloys of gold, bismuth and indium have very thin oxide junctions which can be easily damaged when process temperatures exceeds 70 degrees Celsius.

The state of the art recognized the temperature problems involved in the manufacture of Josephson junction superconductive devices and provided a low temperature process solution. However, the saturated photoresist employed must be specially mixed and specially filtered, and the saturated photoresist material is sensitive to ambient temperatures. It is known that saturated photoresist materials have very low viscosity and must be applied in thin coatings. The processing employs multiple thin coatings of saturated photoresist. When the top layer of photoresist material is made too thin, and a substantial undercut lift-off pattern is being made, the top layer will collapse. Further, since the bottom layer of the photoresist lift-off pattern is substantially thicker than the top layer, longer development time is required to achieve a desired undercut and this permits the developing solution to attack and develop the top thin layer at the edges thus destroying the accuracy of the pattern. The saturated photoresist will combine with and bleed into the unsaturated layer that changes the concentration of both layers at the interface boundary.

Another technique known in the art in electron beam lithography to increase resist sensitivity while maintaining the undercut feature of the developed resist, comprises the coating of two or more resist layers having widely different solubilities. After electron beam exposure, a developer is chosen which develops the top layer much slower than the bottom layer. Alternatively, two mutually exclusive developers can be used for the successive development of the two layers. Both of these approaches result in resist profiles suitable for certain lift-off metallization.

Prior references such as U.S. Pat. No. 4,204,009 teaches a two-layer photoresist lift-off system employing two separate layers of positive photoresist material in which a lift-off pattern is provided at low processing temperatures. The first positive layer of photoresist material is thick and unsaturated. The second positive photoresist layer is comparatively thin and completely saturated. When the two layers are exposed as a laminate layer at the same time through a mask, the areas of both photoresist layers not covered by the mask are exposed to the collimated light source, and when the exposed areas are developed, they are removed. The use of a collimated light source for the denser and saturated upper layer of photoresist results in more isotropic or edge diffusion of the light into the edges of the bottom layer when both layers are exposed as a laminar structure. Furthermore, the edges of the bottom layer are more susceptible to light and are exposed to a greater degree. When the laminar structure is then developed, the bottom layer develops faster than the top layer, wherein the etched pattern extends under the resist, thereby limiting resolution of the pattern definition process.

The processing according to U.S. Pat. No. 5,889,788 employs the formation of resist patterns having two photoresist layers and an intermediate layer, which is another example using multiple layers to form vertical sidewalls. The first photoresist layer coats the substrate and is subjected to masking and exposure. And, the first photoresist is also subjected to develop. A transparent intermediate layer coats the developed first photoresist layer and a second photoresist layer is applied to the intermediate layer. The second photoresist layer is subjected to masking and exposure to form a second photoresist pattern. Etching is used so that the first and second photoresist patterns have a vertical pattern.

In the fabrication of semiconductor devices it is often desirable not only to form patterned conductive layers but also to fabricate conductive layers having some shape or form. For example, rounded chip pads (i.e. "solder balls") enhance electrical contact with other metallization levels. Although there are many known methods for forming a patterned conductor layer on a substrate, the two common methods are subtractive etching and lift-off techniques. Of these two techniques, it has been found that lift-off is more desirable since the solvents used to remove the insulator in lift-off cause less damage to the underlying substrate than do the etch processes used in subtractive etching. Also, the conductor profile resulting from lift-off processing minimizes step coverage problems in subsequent conductor layers.

Thus, while lift-off techniques are a known method of forming patterned conductive layers, it would be of considerable advantage if these techniques could be utilized in order to form patterned conductive layers having varied shapes and complex forms. Furthermore, one of the problems known in the art is obtaining undercut and retrograde photoresist profiles in a controlled and reproducible manner. Another known problem with existing lift-off processing is the difficulty in lifting off metal patterns in first generation processing.

What is needed, therefore, are techniques for performing lithographic processes in a multi-layered system. Such techniques can be employed for enhanced liftoff processes and other applications that require large and controlled undercut. Such a system or process should operate at low processing temperatures and maintain very high accuracy of the mask dimensions.

BRIEF SUMMARY OF THE INVENTION

One embodiment of the present invention provides an improvement to the lithographic processes and corresponding devices resulting therefrom. In one embodiment, the present invention is a multi-layered lithographic structure, comprising a substrate having a first resist layer with a first surface coupled to the substrate and the first resist layer having a first resist open area. A barrier layer is on a second surface of the first resist having a barrier layer open area. There is a second resist layer coupled to the barrier layer, the second resist layer having a second resist open area and wherein the first resist open area is subject to develop subsequent to develop of the second resist layer and etching of the barrier layer. There can be a plurality of structures on the substrate.

Another variation comprises a second barrier layer on the second resist layer with an open second barrier layer open area. A third resist layer can be added on the second barrier layer with a third resist open area, wherein the second resist open area is subject to develop subsequent to develop of the second resist layer and etching of the barrier layer.

In one embodiment the first resist open area, the barrier layer open area, and the second resist open area have variable patterns. Furthermore, the first resist open area, the barrier layer open area, and the second resist open area can have variable sizes, patterns and shapes.

An additional aspect includes wherein the first resist layer and the second resist layer is selected from at least one of the group consisting of azide, polymers and copolymers of polymethylmethacrylate (PMMA), and SU-8. The barrier layer can also be an opaque metallic layer. And, the substrate can be selected from at least one of the group consisting of silicon, gallium arsenide, germanium, glass and metal.

One embodiment of the invention is a method of fabricating a multi-layer lithographic semiconductor, comprising applying a first resist layer to a substrate, masking the first resist layer and exposing the first resist layer, thereby forming a first latent image in the first resist layer. A barrier layer is added to the first resist layer covering the first latent image. Next, applying a second resist layer to the barrier layer, and masking the second resist layer and exposing the second resist layer, thereby forming a second latent image in the second resist layer. And, developing thereby removing the second latent image, etching the barrier layer, and developing thereby removing the first latent image.

Variations of the method comprise preparing the substrate, post-application resist treatments, using alignment tools, softbake and hydration. The etching can be selected from the group consisting of wet etch, dry etch and develop/exposure. The exposing can be selected from the group consisting of ultraviolet light, electrons, and x-rays.

In one embodiment, the shape or pattern formed in the first and second latent image is formed by making a mask using CAD. The mask is then used during exposure to form any pattern desired, as is a standard method with photolithography.

In the multi-layer mode, the method further comprises adding a second barrier layer on the second resist layer, applying a third resist layer on the second barrier layer, masking the third resist layer and exposing the third resist layer, thereby forming a third latent image in the third resist layer.

Next, developing the third latent image, etching the second barrier layer, and developing the second latent image. Finally, the last barrier layer is removed and the bottom layer of photoresist is developed. In the multi-layer method additional layers may be added in a similar manner to form extremely complex three-dimensional precisely defined structures of many layers.

One embodiment of the invention is a lithographic process for fabricating multi-layer semiconductor devices, comprising providing a semiconductor substrate, coating a first resist layer onto the substrate, and exposing the first resist layer with a mask to form a first layer exposed area and a first layer unexposed area. A barrier layer is deposited on the first layer exposed area and the first layer unexposed area, and a second resist layer is deposited on the barrier layer. Next, exposing the second resist layer with a mask to form a second layer exposed area and a second layer unexposed area, and developing the second layer exposed area. Finally, etching the barrier layer, developing the first layer exposed area and fabricating devices on the substrate. Numerous variations and embodiments are applicable and within the scope of the invention.

Variations of the process include depositing of the barrier layer by thermal evaporation, spun coating or by other standard thin film deposition techniques. Thermal evaporation is usually used over sputter deposition because sputter deposition generally contains UV radiation that exposes most lithographic films. However, spin coating, spray coating, thermal evaporation and electroless plating are all acceptable methods to apply the barrier layer.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE SEVERAL VIEWS OF THE DRAWING

The present invention will be readily understood by the following detailed description in conjunction with the accompanying drawings, wherein like reference numerals designate like structural elements, and in which.

DETAILED DESCRIPTION OF THE INVENTION

The methods and embodiments of the multi-layer lithographic processing of the present invention is presented and illustrates the general implementation and is not limited to any particular embodiment therein.

Figure 1:
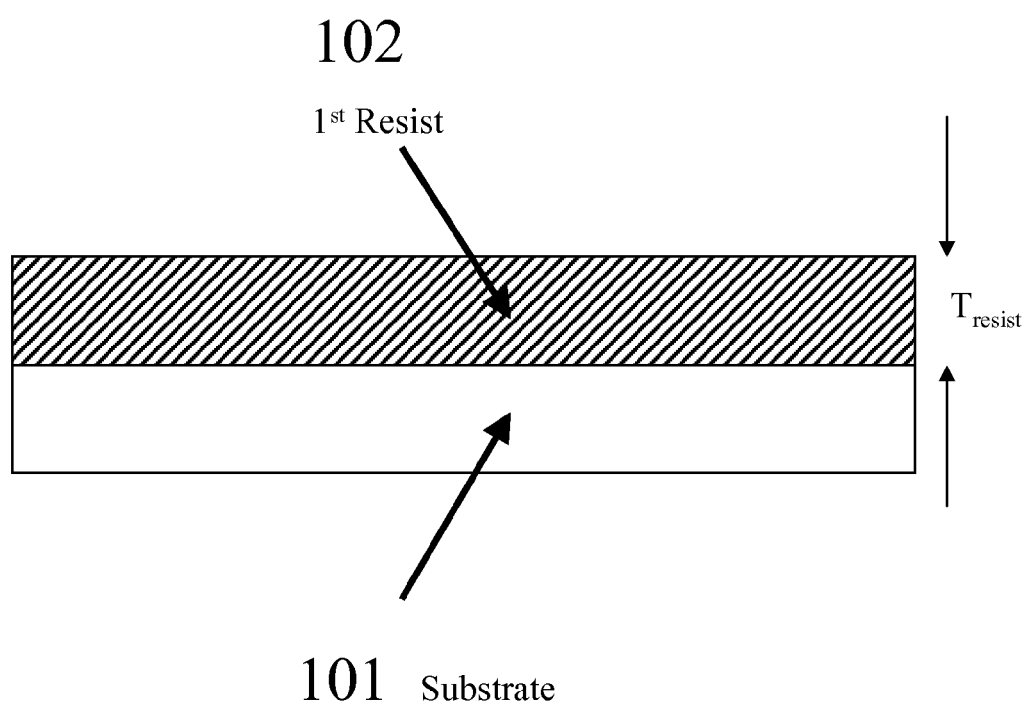
FIG. 1 illustrates a substrate with a conformal coating of photoresist.

Referring to FIG. 1, the process typically commences with a cleaned substrate 101. The substrate represents a wafer that can be any of the known substrates such as silicon, gallium arsenide and germanium as well as other materials as known in the art. The substrate material for the present invention is not restricted to any particular semiconductor material and can also work using non-semiconductor materials. For example, this process also works using a glass substrate or polished metal.

The wafer preparation and cleaning processes are known in the art and can use any of the known solvents to cleanse the substrate. A plasma ash is sometimes used after the solvent to further clean the substrate in preparation for further processing. The cleaning processes and associated treatments are intended to provide a workable substrate and may be eliminated if the substrate is in proper form.

Additional steps may also be implemented to improve performance or yield. For example, a silicon substrate can use a standard vapor prime of hexamethyldisilizane (HMDS) to improve adhesion. HMDS can be applied in a number of manners and is a surface priming treatment to enhance the adhesion of photoresist on the wafer surface. There are other adhesion promoters besides HMDS that may be employed.

A resist 102, such as an azide resist, is adhered to the substrate 101 in this particular embodiment. The resist 102 can be spun coated on the substrate 101 wherein the thickness ($T_{resist}$) is calculated depending upon such factors as the type of resist, the spin speed and resist viscosity. For example, a positive photoresist Shipley S1808 can be spun at 800 RPMs (0.8 KRPMs). Shipley S1808 is a typical azide based resist, and the technique described herein applies to Shipley series 1800 photoresists and to AZ 1500 series photoresists. Other embodiment employ techniques that use polymers and copolymers of polymethylmethacrylate (PMMA) for ebeam resists, SU-8 for micro-electromechanical systems (MEMS) resist as well as other resist materials and systems.

The method described herein uses spin-coating for illustrative purposes and it should be noted that spray coating and other coating methods can also be used with the present invention. The type of resist and the manner of deployment is dependent upon the design requirements and the present invention includes other resist materials and manners of applying the resist to the substrate surface.

Once the resist 102 is deployed on the substrate surface 101, it may be subjected to a softbake process. One example of a softbake would be a hotplate bake at 90 degrees Celsius for sixty seconds. Once the softbake is completed, a hydration step can also be introduced as is known in the art. There are various post-application resist treatments that are known in the art, including hydration and ammonia based image reversal.

Figure 2:
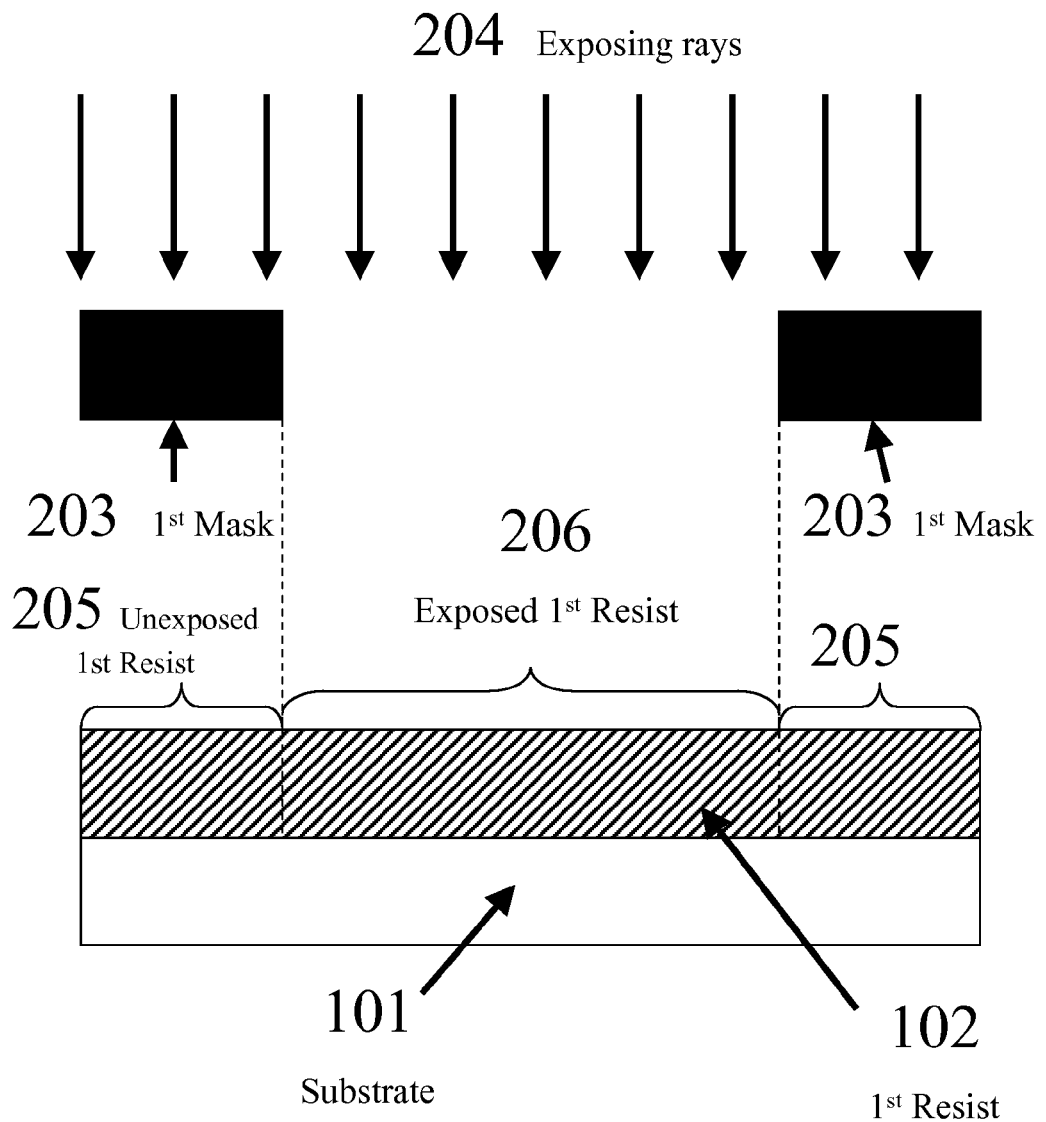
FIG. 2 shows the exposure of the resist.
Figure 3:
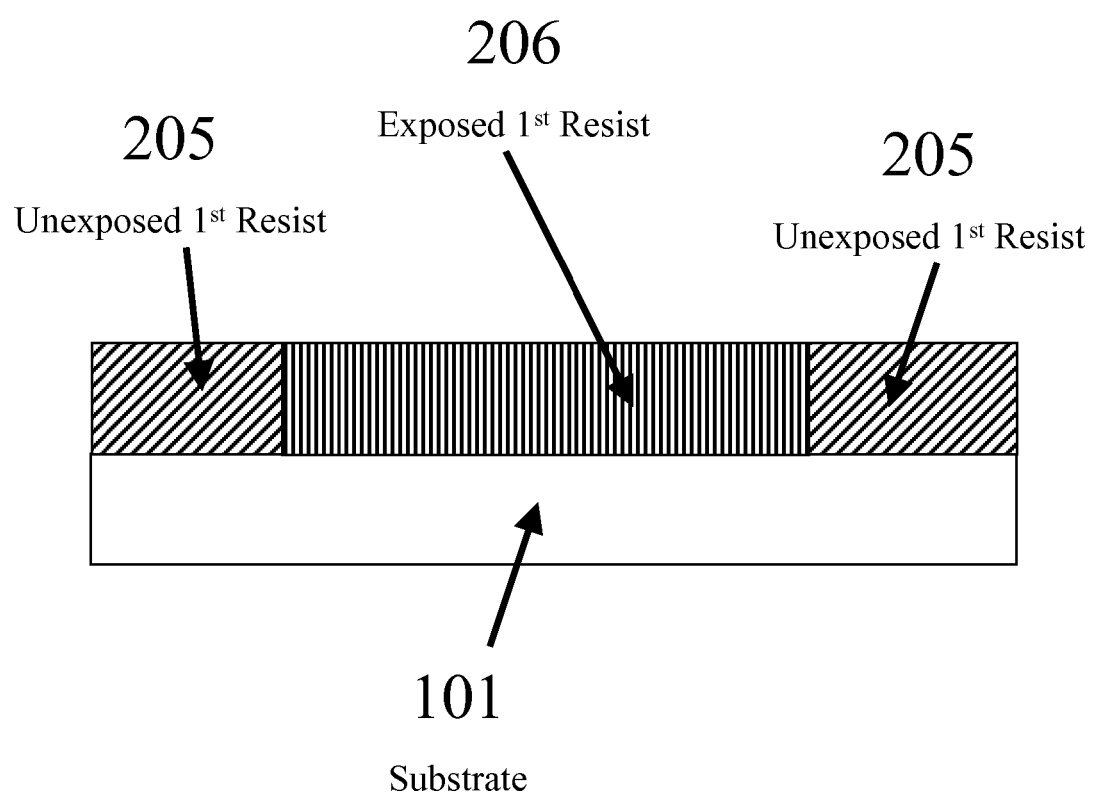
FIG. 3 is a latent image in the photoresist.

Referring to FIG. 2 and FIG. 3, the process continues with the formation of the first layer of resist 102. In one embodiment, a mask or other form of exposure tool 203 is used to block off certain portions of the resist 102 from the radiation 204, thereby forming exposed portions 206 and unexposed portions 205 of the resist. The radiation 204 is commonly ultraviolet light but could also be electrons or x-rays. The exposed areas 206 are defined by exposure tools 203 such as masks and computer data when direct write methods are used. In distinction to the processing known in the art, the first layer resist 102 is exposed but not developed.

Further embodiments for exposure variations comprise broadband UV sources, narrow UV sources, I-line, G-line, and electron beam exposure sources. The processing according to the present invention can also be used with steppers, contact aligners, electron beam pattern generators and other exposure tools.

The first layer undercut is formed as shown in the latent image of FIG. 3 for the exposed area 206 between the unexposed resist areas 205. The latent image portion 206 represents the 'invisible' image produced by the incident exposure rays and is subsequently rendered visible by development processing. The exposed resist area 206 is dependent upon the incident exposure of the radiation 204, wherein a typical exposure is about 200 mJ.

After the exposure of radiation 204, a second softbake can be used to densify the resist structure 205, 206 wherein a typical softbake is about sixty minutes at 90 degrees Celsius in a convection oven or 60 seconds at 90 degrees Celsius using a vacuum hotplate.

Figure 4:
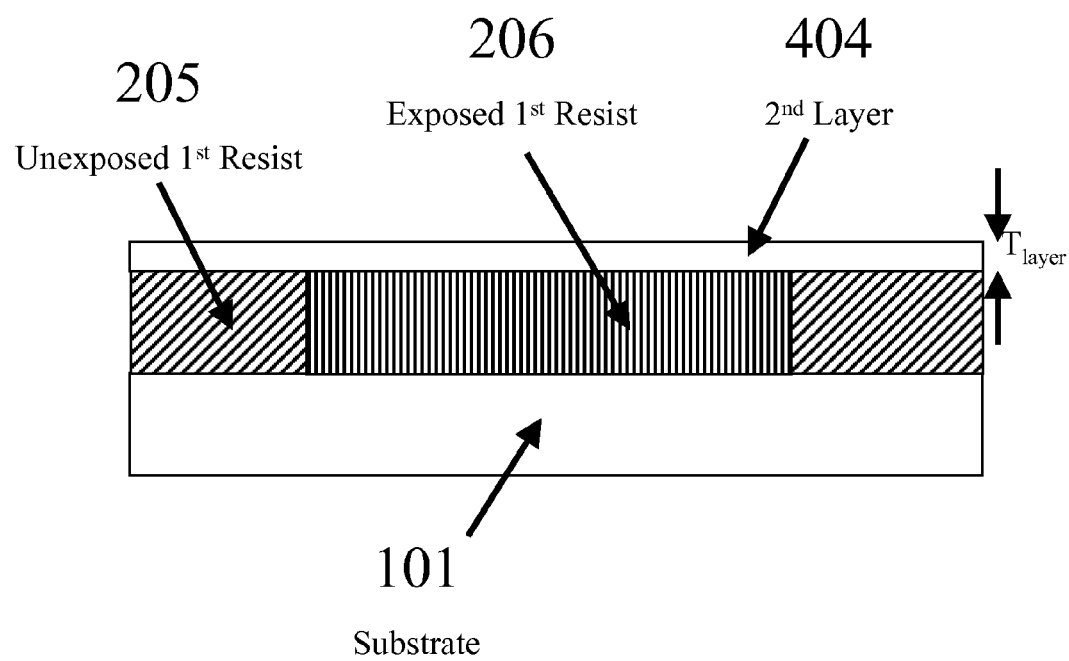
FIG. 4 illustrates a coating of thin film/barrier layer over exposed resist.

Referring to FIG. 4, a second layer 404 is added to the resist layer 205 and 206. This barrier layer 404 is generally conductive such as a metal however other materials such as polymers could also be employed. The second layer 404 is generally selected to have good adhesion characteristics and is immiscible in the resist layers, and functioning as a barrier to the second subsequent exposure. The thickness ($T_{layer}$) of the barrier layer 404 depends upon processing conditions. For example, the second layer 404 in one embodiment is 3000 Angstroms of gold thermally evaporated. Titanium and Aluminum are also possible materials for the second layer.

In general, electron beam deposition and/or sputtering is not used for the second layer deposition as the resist may be ultraviolet (UV) sensitive and the electron beams and/or sputtering might generate UV radiation during the evaporation process.

Metal is one embodiment for the opaque thin film barrier layer. Other materials may be used other than metal as known by those skilled in the art. There are certain variables such as metal film integrity, defects, thickness requirement for opacity that are some of the design criteria used in the selection of the second layer (i.e. the barrier layer). The opacity of the metal is dependent to a certain extent to the wavelength of the exposing medium. For visible radiation, metal films generally become opaque around 500 Angstroms. For X-ray opacity the films generally will be much thicker. Opacity is dependent upon a number of variables as known by those skilled in the art, and the present invention only needs to obtain a reasonable contrast for functionality.

Figure 5:
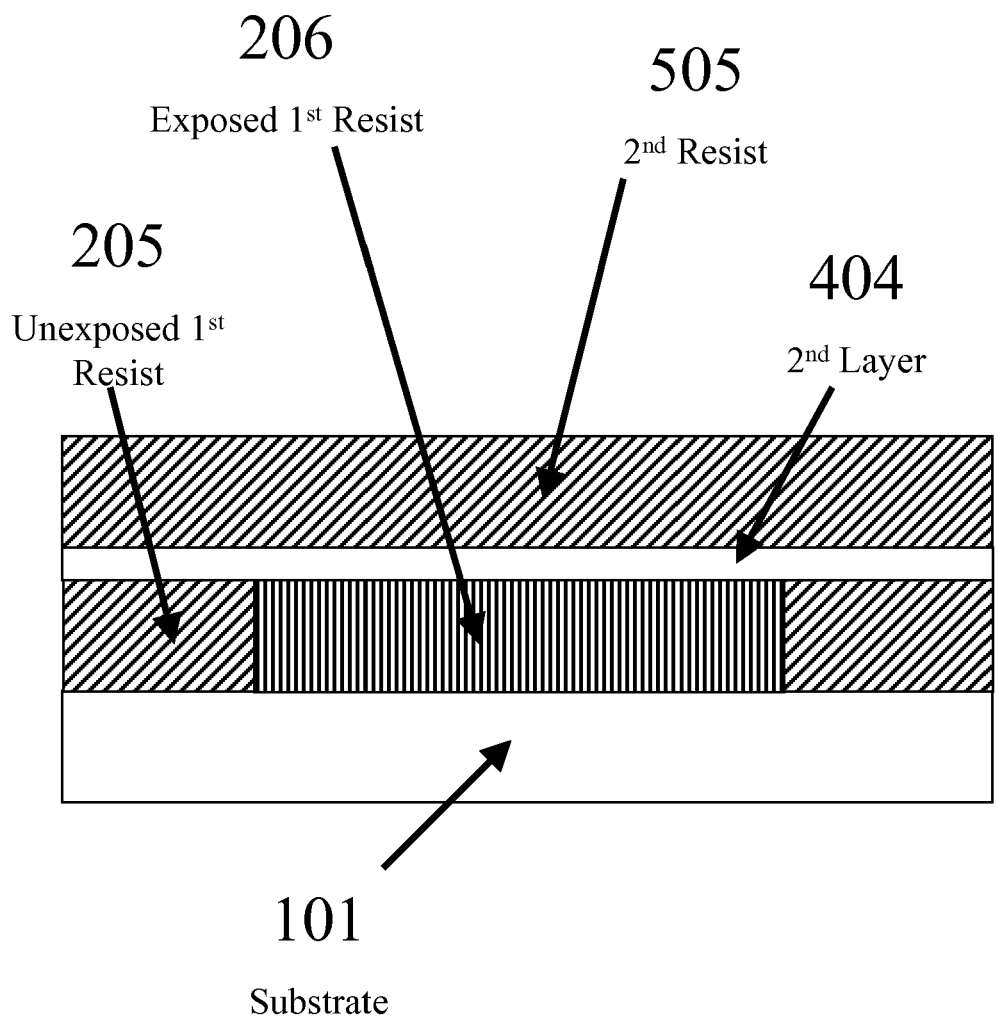
FIG. 5 illustrates overcoating of the photoresist and introduction of the second resist layer.

A second layer of photoresist material 505 is applied as shown in FIG. 5, thereby making a three-layer stack. In one embodiment the second layer of photoresist 505 is spun on the two-layer stack, wherein the resist could be a positive photoresist such as Shipley S1827. A typical spin speed for this resist is about 2.5 KRPMs that generates about a four micron thick layer, however the variables in the process allow for adjustments.

Optionally, the second layer photoresist 505 can be subjected to a softbake process such as a hotplate bake for 90 seconds at 90 degrees Celsius. A hydration step can also be employed.

Figure 6:
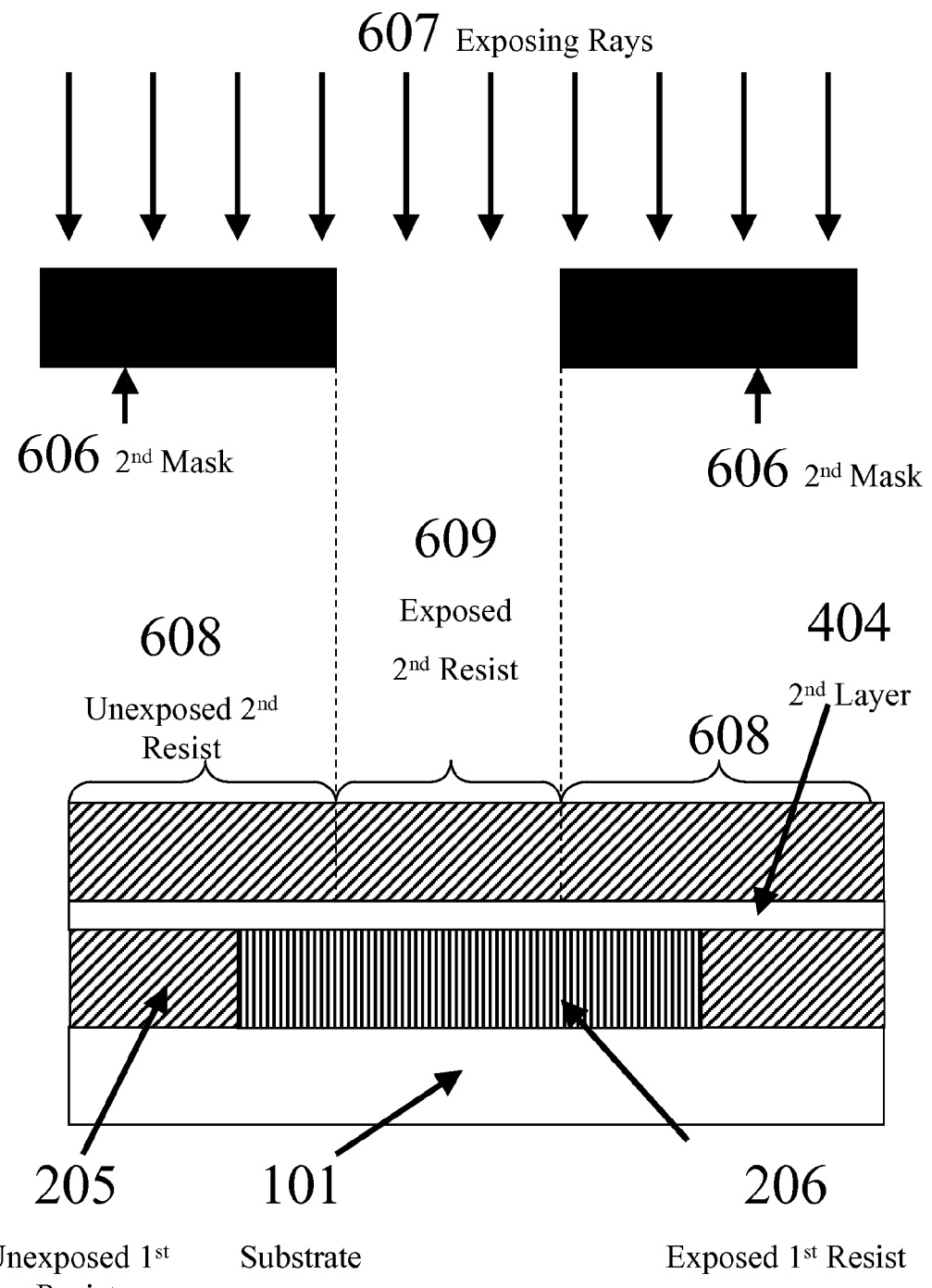
FIG. 6 shows the exposure of the top layer of photoresist exposed by the radiation, wherein the radiation does not penetrate to the first layer because the barrier layer stops the radiation from penetrating.

Referring to FIG. 6, one of the features of the present invention is illustrated wherein the top layer of photoresist is exposed by the radiation 607, but this radiation does not penetrate to the first layer 205, 206 because the barrier layer 404 stops the radiation from penetrating. This allows one latent image to be placed on top of a second independent latent image. And if needed, a third, fourth and up to an $n^{th}$ layer may be added. Thus, the barrier layer 404 performs two functions. First, the barrier layer 404 stops the two resist layers from intermixing. Second, the barrier layer 404 stops the top radiation exposure from reaching the bottom layer of photoresist that was previously exposed. This makes the two latent images fully independent.

Referring again to FIG. 6, the top layer of photoresist is exposed to radiation 607 with a photomask 606 used to define the exposed areas of the second layer photoresist 609 from the unexposed second layer photoresist 608. The radiation exposure 607 can be accomplished using the techniques knows in the art such as a contact aligner, a stepper, or a direct write electron beam.

Figure 7:
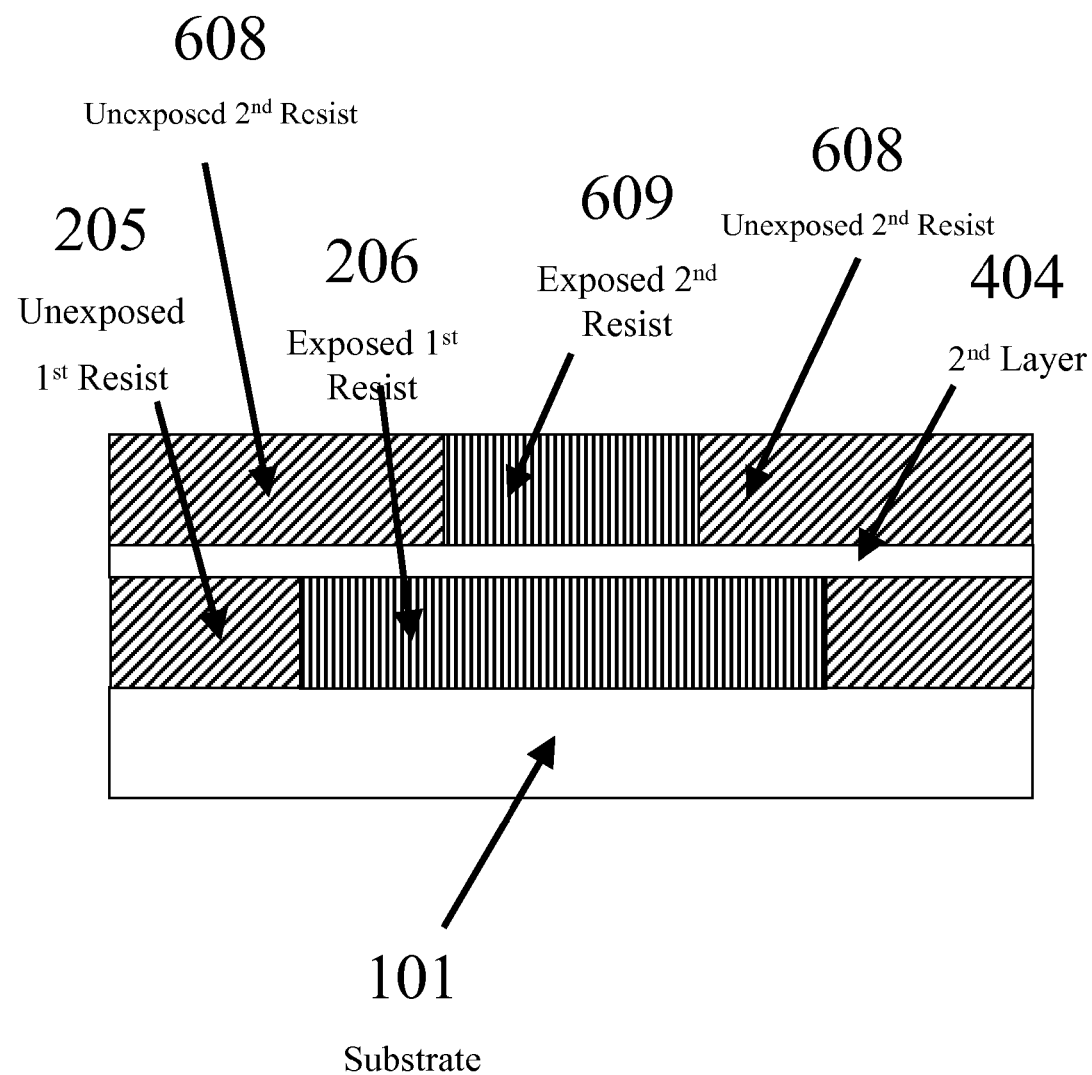
FIG. 7 shows a latent image in both photoresist layers.

Upon completion of the radiation exposure 607, the second layer photoresist comprises an exposed region 609 and the unexposed regions 608, which is depicted in the latent image of FIG. 7. As known in the art, the size, shape, and pattern of the regions 608, 609 are dependent upon the design criteria and desired application.

Figure 8:
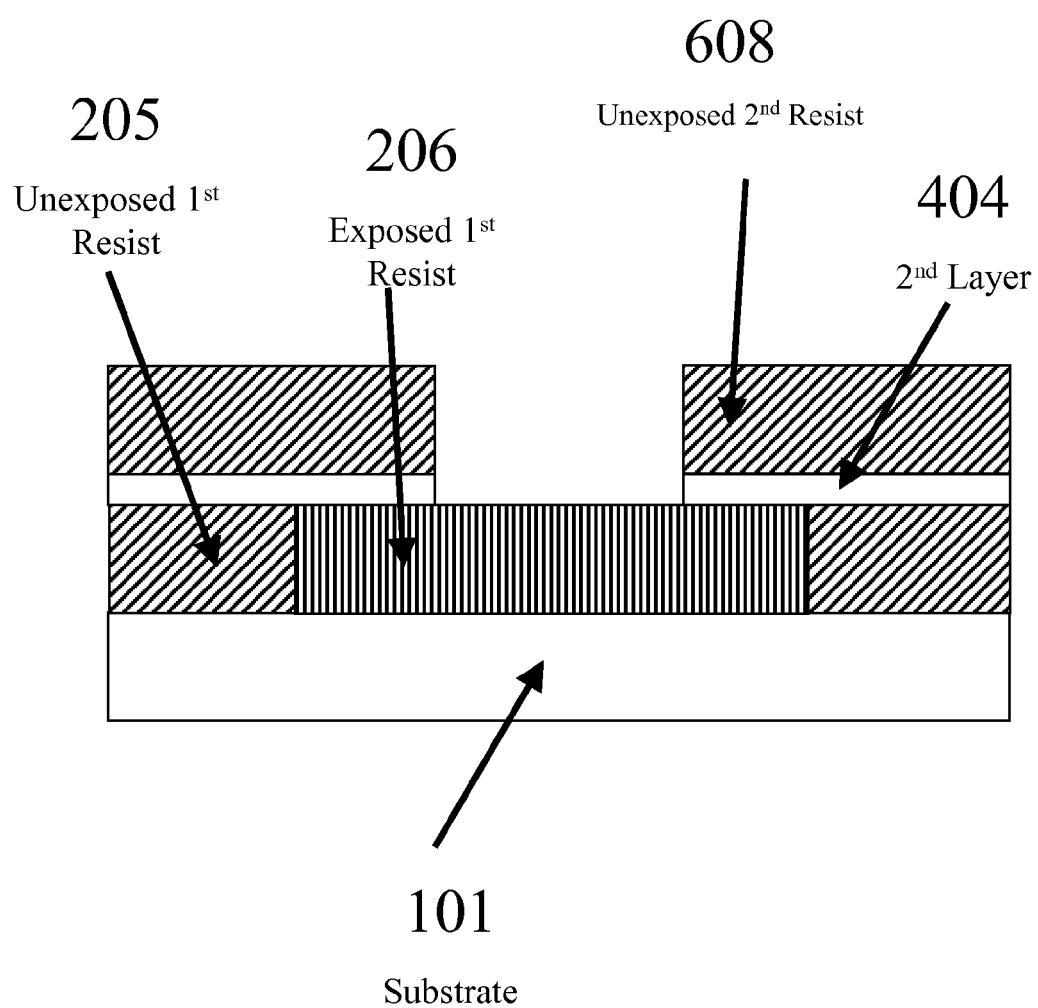
FIG. 8 depicts the development of top layer of resist and etching of the barrier layer.

Upon completion of the exposure of the second layer of photoresist, the second resist layer is developed. As illustrated in FIG. 8, the exposed area 609 of FIG. 7 is removed by the developer. During development, the unwanted areas in the photoresist are dissolved by the developer. In the case wherein the exposed areas become soluble in the developer, a positive image of the mask pattern is produced on the resist. Such a resist is therefore called a positive photoresist. Negative photoresist layers result in negative images of the mask pattern, wherein the exposed areas are made soluble in the developer. Wafer fabrication may employ both positive and negative photoresists, although positive resists are generally preferred because they offer higher resolution capabilities. One example of a develop is a one minute immersion in Shipley positive photoresist developer MF319. Other developers including negative developers are within the scope of the invention. Thus, this invention can be used and is completely compatible with both positive and negative resist processing. Also, this invention can be used with positive resist processing being used for the bottom resist layer and negative resist processing being used on the top layer or vice versa. The processing according to the present invention is compatible with automated track developing.

The middle or second layer 404 is removed as shown in FIG. 8 such that the first resist layer is exposed. There are numerous techniques to remove the second layer 404 such as wet etch, dry etch, exposure/developer as is known in the art. A wet etch can be used to etch the thin film, for example, a gold (Au) metal thin film used to separate the layers of photoresist can be wet etched with potassium iodide (KI). A dry etch can also be used to remove a portion of the second layer. If a photosensitive polymer were used for the second layer, an exposure and develop processing would remove the layer. Regardless of the technique used for the removal of the second layer 404, the second layer of the three-layer stack of FIG. 8 separates the photoresist layers 608, 205.

The barrier or second layer 404 generally will be opaque to actinic radiation, which is radiation that exposes photoresist. Furthermore, in one embodiment the interfacial barrier layer 404 is a metal that is deposited by thermal evaporation and similar deposition techniques known in the art. Sputter or electron beam deposition is not generally recommended as it may emit actinic radiation that would expose the bottom resist. Thus, according to one embodiment the present invention employs an interfacial layer 404 which is deposited by techniques that do not expose the bottom resist. And in one embodiment, the second layer 404 is opaque to the radiation used to expose the bottom layer of resist.

Figure 9:
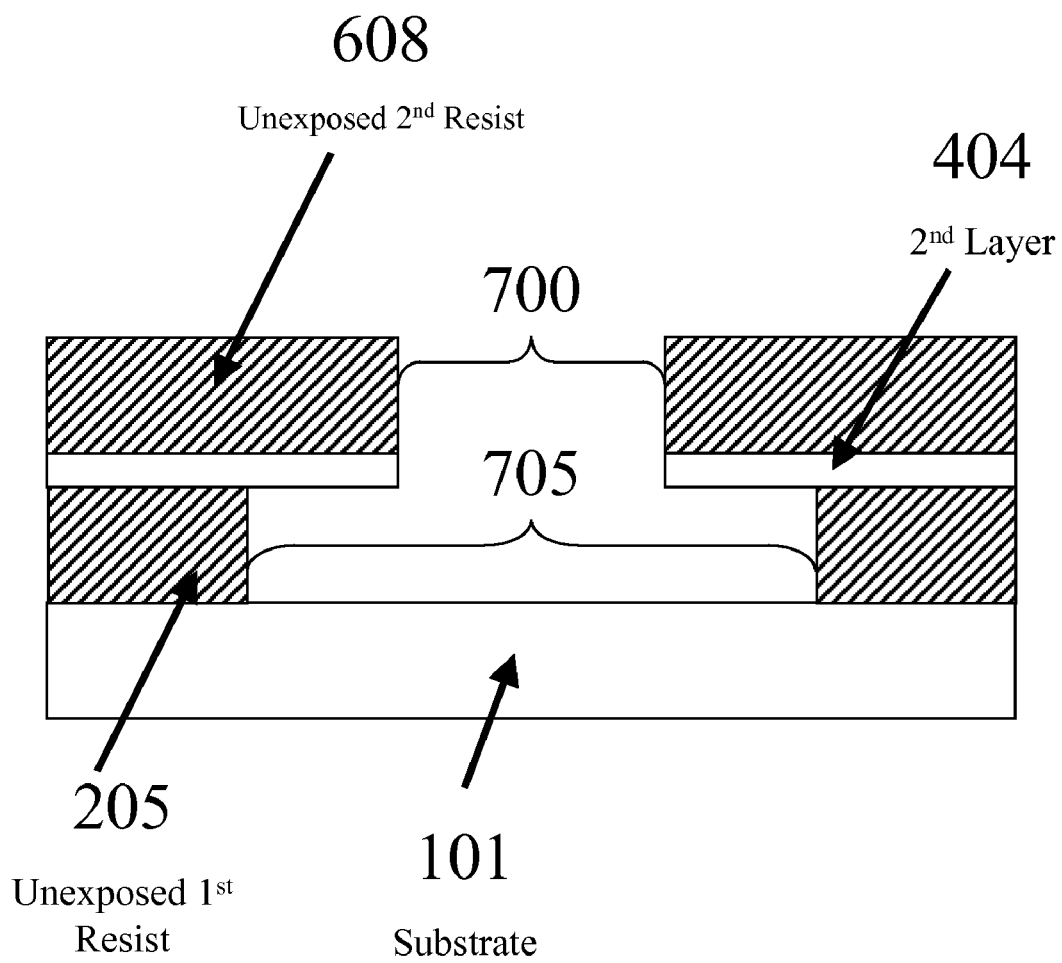
FIG. 9 shows the develop of the bottom layer of resist.

Referring to FIGS. 8 and 9, the bottom exposed first resist layer 206 is removed thereby exposing the substrate 101. In one embodiment the first resist layer 206 is removed by a develop process such as an immersion develop or on an automated track developer system. One illustrative example employed a thirty-second develop step using Shipley MF319 developer.

The undercut as described herein is a measure of the top opening 700, furthest from the substrate 101, as compared to the opening at the bottom 705, nearest to the substrate 101. In this particular application, an undercut having a greater opening near the bottom 705 is desired for metal deposition and lift-off. The present technique, while being described as a method for forming a useful resist lift-off profile, is not limited to liftoff applications. This process may be used for any application where a multilayer stack of resists is desired having different independent latent images developed out independently for semiconductor, MEMS or other manufacturing applications.

While the description and drawings illustrate a three-layer stack, this is for convenience in the explanation of the process and the present invention is not thereby limited. In addition, the layer thicknesses and amount of undercut are independently controlled with the processing of the present invention.

Figure 10:
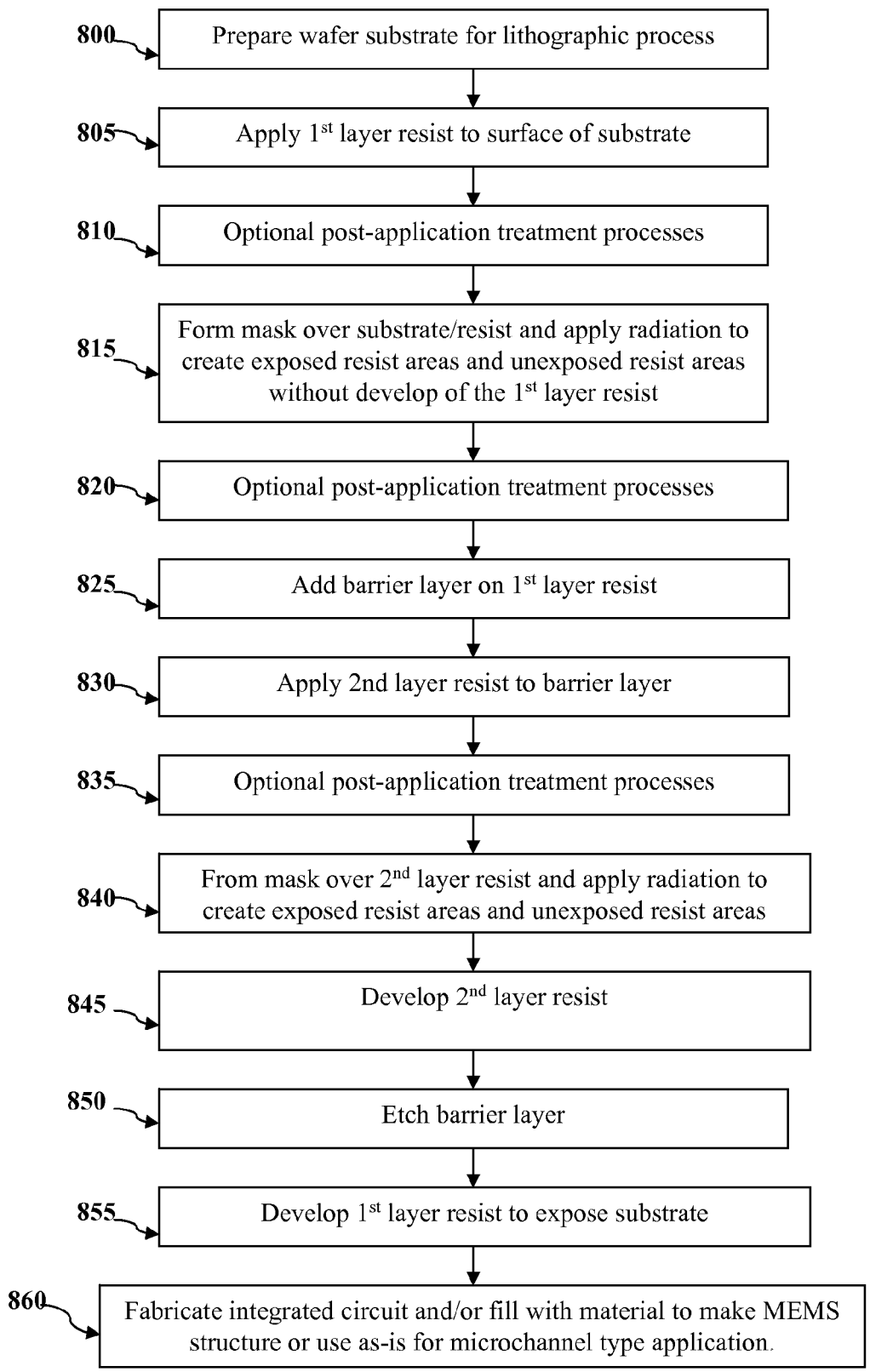
FIG. 10 is a process flow for one embodiment of the lithography process of the present invention.

The process for one embodiment of the present invention is shown in FIG. 10. A substrate is prepared for the fabrication process as is known in the art 800. A resist coating is applied to the substrate wherein the first resist coating is applied according to the desired thickness 805. An optional softbake or post treatment process can be employed 810. The first resist coating is then subjected to radiation to form a first latent image employing some form of masking technique thereby creating an exposed area and an unexposed area of the first resist layer 815. An optional post exposure treatment step may be employed 820 however the resist is not developed at this time.

Next, a barrier layer is formed on the first layer resist 825. The barrier layer is typically a conductive metal that can be evaporated onto the surface of the first layer resist and in one embodiment the intermediate barrier layer is approximately opaque. A second layer of resist is applied to the barrier layer 830 and can be subjected for post treatment such as a softbake 835. The second layer resist is then appropriately masked and undergoes exposure to create exposed areas and unexposed areas on the second resist layer and form a second latent image 840. The second resist layer is developed to remove the desired resist material exposing a section of the barrier layer 845. The barrier layer is then etched to remove a portion of the barrier layer 850. The first resist layer is then developed to expose a section of the substrate 855. Finally, the processing continues with the integrated circuit design 860. This allows the top opening of a multi-layered stack and the undercut sizes to be independently controlled by mask dimensions. The processing can further be implemented using various alignment tools. In the embodiment described herein a stepper can be used for processing and the stepper is easily aligned to the etch alignment crosses in the substrate. For contact lithography etch alignment keys can be implemented and are within the scope of the invention. If desired, the alignment key area could be developed before the defining exposure to open the alignment key area.

Figure 11:
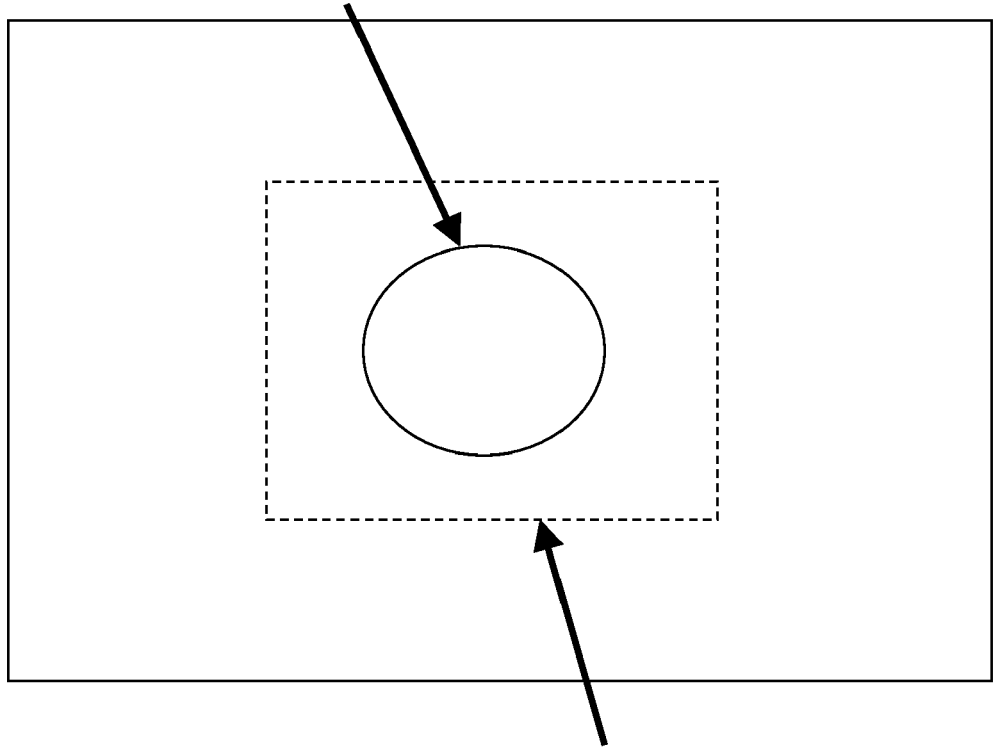
FIG. 11 graphically shows that the layers can have varied shapes as illustrated from the top perspective view of the multi-layer stack.

It should be readily appreciated that the patterns or shapes for the layers may be "shifted" with respect to one another and/or contain significant differences in the overall patterns. For example, referring to FIG. 11 showing a top view perspective of a multi-layer stack 900 fabricated according to the present invention, wherein a square pattern is exposed in the bottom layer of photoresist 905 and a circular pattern is exposed onto the top layer 910. Various shapes and sizes can be employed within the scope of the invention according to design criteria and requirements. For example, squares, rectangles, circles, ovals, triangles, polygons can be readily produced on any layer as well as extremely complex and non-contiguous/contiguous shapes. And, as can be readily appreciated, the illustration of a single stack 900 is for convenience as there can be an array of stacks on a given substrate.

Figure 12:
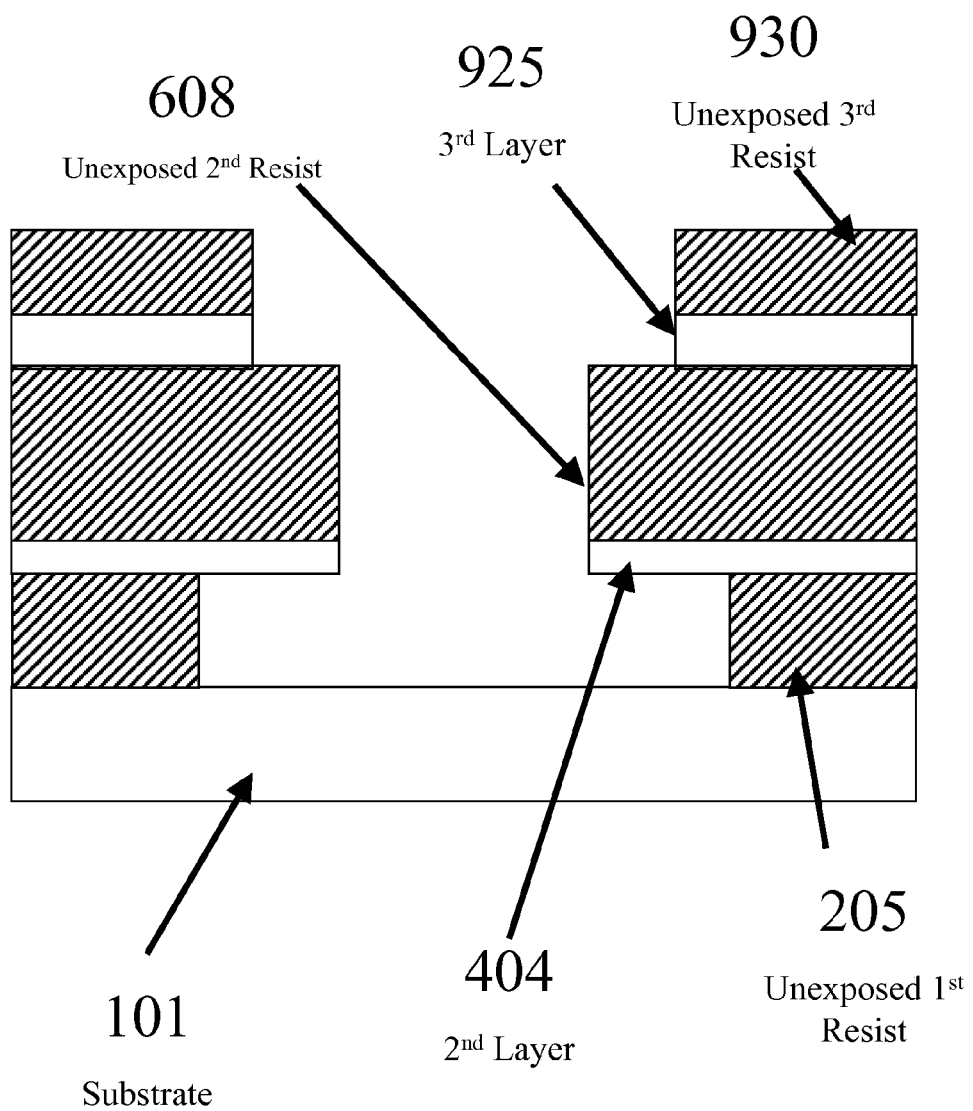
FIG. 12 is a side view perspective of a five layer lithographic stack showing the varying thicknesses of the layers as well as the dimensioned undercut.

Referring to FIG. 12, for a different application such as a MEMS implementation utilizing three photoresist layers and two barrier layers, it may be desirable to make the first photoresist layer opening larger than the middle photoresist layer and the top photoresist layer also larger than the middle layer to make an hourglass type structure. The structure is fabricated as described herein having an unexposed first resist layer 205 and an unexposed second resist layer 608, with the etched barrier layer 404 sandwiched therebetween. There is a further barrier layer 925 and a top unexposed resist layer 930 forming the 'hourglass' structure. As depicted, the thicknesses of the various layers may differ according to the design constraints and requirements. Furthermore, the openings forming the undercut may also vary. The techniques described herein are flexible and readily adaptable to different requirements and applications.

A feature of the present invention relates to the controlled exposure of the first layer which allows specific control of the first photoresist layer. Multi-layer stacks of more than three layers require some degree of control, and the present invention makes these multi-layered structures possible. For example, a six-layer photoresist stack can be formed using the processes of the present invention to make a vertical dumbbell shaped object. One of the aspects of the present invention is the ability to form complex shapes using the photoresist techniques described herein, which supports emerging MEMS technologies.

The art in the general field of the invention is extensive, however there are no known techniques which can form complex patterns in photoresist as detailed by the present invention. Among other differences, none of the art pre-exposes the bottom layer with a specific pattern and then uses thermal techniques to interpose an opaque (metallic) layer. The state of the art also does not incorporate latent imaging in the first layer for process control or for the formation of complex three-dimensional structures.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

The invention claimed is:

1. A method of fabricating a multi-layer lithographic semiconductor, comprising:
   applying a first resist layer to a semiconductor substrate;
   masking said first resist layer and exposing said first resist layer, thereby forming a first latent image in said first resist layer;

adding an opaque barrier layer to said first resist layer covering said first latent image;

applying a second resist layer to said opaque barrier layer;

masking said second resist layer and exposing said second resist layer, thereby forming a second latent image in said second resist layer;

removing said second latent image;

etching said opaque barrier layer; and removing said first latent image.

2. The method of claim 1, further comprising preparing said substrate.

3. The method of claim 1, further comprising applying post-application resist treatments.

4. The method of claim 3, wherein said post-application resist treatments are selected from at least one of the group consisting of: softbake, hydration, and ammonia based image reversal.

5. The method of claim 1, wherein a shape of said first latent image and the second latent image is selected from the group consisting of: square, rectangle, triangle, circle, oval, and polygon.

6. The method of claim 1, wherein said etching is selected from the group consisting of wet etch, dry etch and develop/exposure.

7. The method of claim 1, wherein said exposing uses rays selected from at least one of the group consisting of ultraviolet light, electrons, and x-rays.

8. The method of claim 1, further comprising using alignment tools.

9. The method of claim 1, further comprising adding a second opaque barrier layer on said second resist layer, applying a third resist layer on said second opaque barrier layer, masking said third resist layer and exposing said third resist layer, thereby forming a third latent image in said third resist layer, removing said third latent image, etching said second opaque barrier layer, and removing said second latent image.

10. A lithographic process for fabricating multi-layer semiconductor devices, comprising:

providing a substrate;

coating a first resist layer onto said substrate;

exposing said first resist layer with a mask to form a first layer exposed area and a first layer unexposed area;

depositing an opaque barrier layer on said first layer exposed area and said first layer unexposed area;

coating a second resist layer onto said opaque barrier layer;

exposing said second resist layer with a mask to form a second layer exposed area and a second layer unexposed area;

developing said second layer exposed area;

etching said opaque barrier layer;

developing said first layer exposed area; and fabricating devices on said substrate.

11. The lithographic process according to claim 10, wherein said depositing is selected from the group consisting of: thermal evaporation, spin coating, spray coating, and electroless plating.

12. The lithographic process according to claim 10, wherein said step of coating is spun coating.

* * * * *

UNITED STATES PATENT AND TRADEMARK OFFICE
CERTIFICATE OF CORRECTION

| | | |
|---|---|---|
| PATENT NO. | : 7,229,745 B2 | Page 1 of 1 |
| APPLICATION NO. | : 10/710023 | |
| DATED | : June 12, 2007 | |
| INVENTOR(S) | : Philip A. Lamarre | |

It is certified that error appears in the above-identified patent and that said Letters Patent is hereby corrected as shown below:

Col. 1 lines 8-11, please delete "STATEMENT REGARDING FEDERALLY SPONSORED RESEARCH OR DEVELOPMENT Portions of the present invention may have been made in conjunction with Government funding under contract number DAAB07-00-D-D329, and there may be certain rights to the Government."

Signed and Sealed this

Thirty-first Day of January, 2012

David J. Kappos
*Director of the United States Patent and Trademark Office*